(12) United States Patent
Shin

(10) Patent No.: US 8,698,169 B2
(45) Date of Patent: Apr. 15, 2014

(54) ORGANIC LIGHT EMITTING DIODE DISPLAY

(75) Inventor: Hyun-Eok Shin, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/188,902

(22) Filed: Jul. 22, 2011

(65) Prior Publication Data
US 2012/0138966 A1 Jun. 7, 2012

(30) Foreign Application Priority Data

Dec. 3, 2010 (KR) .................. 10-2010-0122705

(51) Int. Cl.
*H01L 29/80* (2006.01)
*H01L 33/00* (2010.01)
*H01L 23/24* (2006.01)

(52) U.S. Cl.
USPC ........ 257/88; 257/82; 257/687; 257/E51.002; 257/E33.012; 257/E33.001; 257/E33.062; 257/E33.066; 257/E25.012

(58) Field of Classification Search
USPC .............. 257/88, E33.012, 82, 687, E51.002, 257/E33.001, E33.062, E33.066, E25.019
See application file for complete search history.

(56) References Cited

U.S. PATENT DOCUMENTS

| 6,127,202 A * | 10/2000 | Kapur et al. .................. 438/47 |
|---|---|---|
| 6,608,333 B1 * | 8/2003 | Lee et al. .................. 257/98 |
| 7,821,637 B1 | 10/2010 | Pfeiffer et al. |
| 2005/0052119 A1 | 3/2005 | Yu et al. |
| 2007/0222923 A1 | 9/2007 | Wang et al. |
| 2008/0246392 A1 * | 10/2008 | Kho et al. .................. 313/504 |
| 2010/0224864 A1 * | 9/2010 | Chiang et al. .................. 257/40 |
| 2010/0295031 A1 * | 11/2010 | Seo et al. .................. 257/40 |
| 2011/0018089 A1 * | 1/2011 | Hakuma et al. .................. 257/463 |
| 2011/0084279 A1 * | 4/2011 | Kwon et al. .................. 257/59 |

FOREIGN PATENT DOCUMENTS

| KR | 10-0556374 | 2/2006 |
|---|---|---|
| KR | 1020060084850 A | 7/2006 |
| KR | 10-0700012 | 3/2007 |
| WO | WO 2005/007237 A2 | 3/2005 |
| WO | WO 2005/027237 A3 | 3/2005 |

OTHER PUBLICATIONS dictionaryInterpretation conductive and electrode.pdf.*
http://www.thefreedictionary.com/conductive (no Date) http://www.thefreedictionary.com/electrode (no Dtae).*
*Silver and Sulfur: Case Studies, Physics, and Possible Solutions*, by Craig Hillman, Joelle Arnold, Seth Binfield, and Jeremy Seppi. http://www.dfrsolutions.com/pdfs/2007_10_silver_silver_sulfur.pdf.
Hu et al., Photocurrent enhancement of Copper (II) phthalocyanine on nanogap thin film electrodes, IEEE Transaction on Nanotechnology, vol. 11 No. 6, Nov. 2012, pp. 1073-1079.
First semiconductor effect is recorded http://www.computerhistory.org/semiconductor/timeline/1833-first.html on Jun. 4, 2013.
Electrical conductivity and resistivity http://www.ndt-ed.org/EducationResources/CommunityCollege/Materials/Physical_Chemical/Electrical.htm on Jun. 5, 2013.
Effects of thin film thickness on emittance, reflectance and transmittance of nano scale multilayers, Oloomi, Saboonchi, and Sedaghat, IJPS vol. 5(5)pp. 465-469 May 2010.

* cited by examiner

*Primary Examiner* — Evan Pert
*Assistant Examiner* — Moazzam Hossain
(74) *Attorney, Agent, or Firm* — Robert E. Bushnell, Esq.

(57) ABSTRACT

An organic light emitting diode (OLED) display includes a first electrode including a conductive black layer, a second electrode facing the first electrode, and an organic emission layer provided between the first electrode and the second electrode.

17 Claims, 9 Drawing Sheets

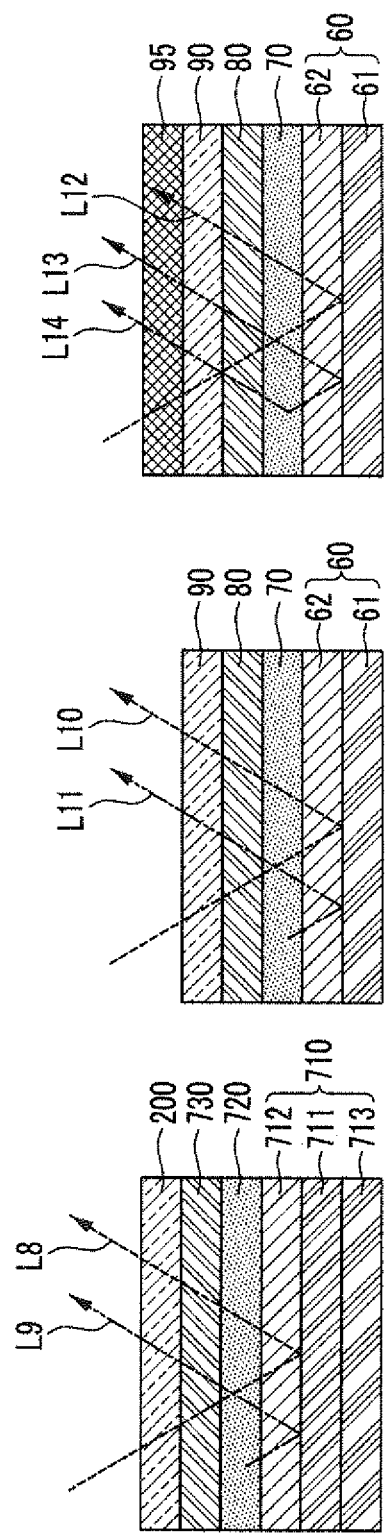

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on the 3$^{rd}$ of December 2010 and there duly assigned Serial No. 10-2010-0122705.

BACKGROUND OF THE INVENTION

1. Field of the Invention

The present invention relates generally to an organic light emitting diode (OLED) display. More particularly, the present invention relates to an organic light emitting diode (OLED) display having an organic emission layer between two electrodes.

2. Description of the Related Art

A display device displays images, and the organic light emitting diode display has been in the spotlight.

The organic light emitting diode (OLED) display includes an organic light emitting diode for displaying an image by emitting light, a first substrate and a second substrate facing each other with the organic light emitting diode therebetween, and a polarizing plate attached to at least one of the first substrate and the second substrate to suppress light reflection caused by the organic light emitting diode.

However, the polarizing plate included in the organic light emitting diode display absorbs light except some light, having an optical axis from among the light emitted by the organic light emitting diode, thereby deteriorating the luminance of the image displayed by the organic light emitting diode (OLED) display.

The above information disclosed in this Background section is only for enhancement of an understanding of the background of the described technology, and therefore it may contain information that does not form the prior art which is already known in this country to a person of ordinary skill in the art.

SUMMARY OF THE INVENTION

The present invention has been developed in an effort to provide an organic light emitting diode (OLED) display with improved display quality.

An exemplary embodiment of the present invention provides an organic light emitting diode display that may be constructed with a first electrode including a conductive black layer; a second electrode facing the first electrode; and an organic emission layer provided between the first electrode and the second electrode.

The first electrode further includes a first conductive layer provided between the conductive black layer and the organic emission layer.

The first conductive layer has a lesser work function than the second electrode.

The first conductive layer is light reflective.

The first conductive layer is thinner than the conductive black layer.

The first conductive layer has a greater work function than the second electrode.

The first conductive layer is light opaque.

The first electrode further includes a second conductive layer separated from the organic emission layer with the conductive black layer therebetween.

The conductive black layer is formed by heat treating the second conductive layer under a sulfur (S) atmosphere.

The conductive black layer includes silver sulfide ($Ag_2S$).

Another embodiment of the present invention provides an organic light emitting diode display may be constructed with a first substrate; a second substrate facing the first substrate; and an organic light emitting element provided between the first substrate and the second substrate, and including a first electrode including a conductive black layer, a second electrode facing the first electrode, and an organic emission layer provided between the first electrode and the second electrode.

Another embodiment of the present invention provides an electrode of an organic light emitting diode display device having a metal layer bearing a black coating of a metal sulfide.

According to the embodiments, a display device with improved display quality is provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIGS. 9A-9C are cross-sectional views of major constituent elements in an organic light emitting diode (OLED) display according to a second experimental example, a third comparative example, and a fourth comparative example, respectively, of the present invention.

DETAILED DESCRIPTION OF THE INVENTION

Figure 1:
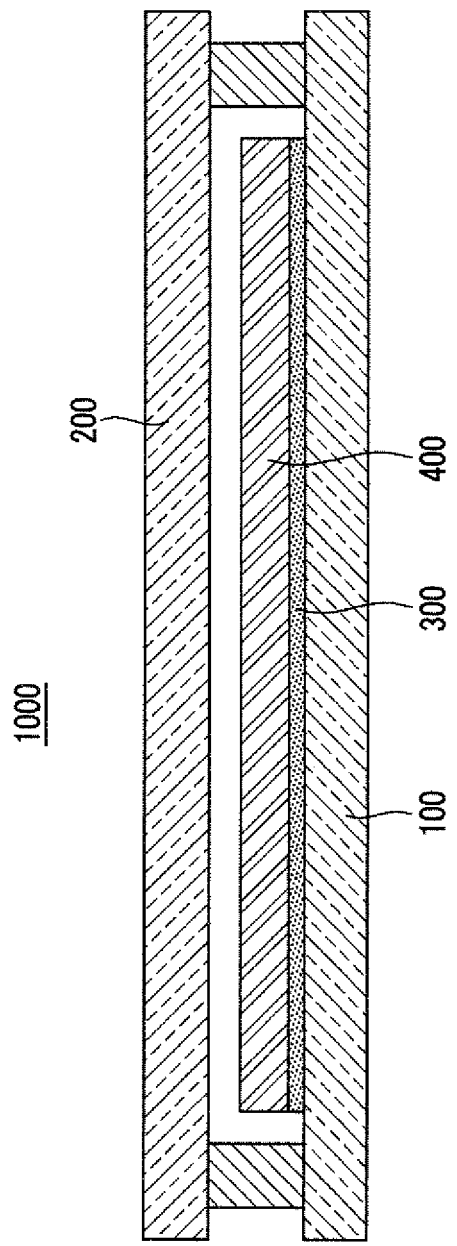
FIG. 1 is a cross-sectional view of an organic light emitting diode (OLED) display according to a first exemplary embodiment of the present invention.

In the following detailed description, only certain exemplary embodiments have been shown and described, simply by way of illustration. As those skilled in the art will realize, the described embodiments may be modified in various different ways, all without departing from the spirit or scope of the present invention.

Accordingly, the drawings and description are to be regarded as illustrative in nature and not restrictive, and like reference numerals designate like elements throughout the specification.

Constituent elements having the same structures throughout the embodiments are denoted by the same reference numerals and are described in a first embodiment. In the other embodiments, only constituent elements other than the same constituent elements will be described.

The size and thickness of each component shown in the drawings are arbitrarily shown for understanding and ease of description, but the present invention is not limited thereto.

In the drawings, the thickness of layers, films, panels, regions, etc. are exaggerated for clarity. In addition, in the drawings, for understanding and ease of description, the thicknesses of some layers and areas are exaggerated. It will be understood that, when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. In addition, throughout the specifications, when an element is said to be "on" another element, it is either positioned on or below a portion of a target, or positioned on an upper side based on a gravity direction.

An organic light emitting diode (OLED) display according to a first exemplary embodiment will now be described with reference to FIG. 1 to FIG. 4.

FIG. 1 is a cross-sectional view of an organic light emitting diode (OLED) display according to a first exemplary embodiment of the present invention.

As shown in FIG. 1, the organic light emitting diode (OLED) display 1000 includes a first substrate 100, a second substrate 200, a wire 300, and an organic light emitting element 400.

The first substrate 100 and the second substrate 200 are insulating substrates including glass, a polymer, or stainless steel, and at least one of the first substrate 100 and the second substrate 200 is made of a light opaque material. The wire 300 and the organic light emitting element 400 are provided on the first substrate 100, and the second substrate 200 faces the first substrate 100 with the wire 300 and the organic light emitting element 400 therebetween. The first substrate 100 and the second substrate 200 are mutually bonded and sealed by a sealant with the organic light emitting element 400 therebetween, and the first substrate 100 and the second substrate 200 protect the wire 300 and the organic light emitting element 400 from interference.

The wire 300 includes switching and driving thin film transistors 10 and 20 (shown in FIG. 2), and transmit a signal to the organic light emitting element 400 to drive the organic light emitting element 400. The organic light emitting element 400 emits light according to the signal transmitted by the wire 300.

The organic light emitting element 400 is provided on the wire 300.

The organic light emitting element 400 is provided in a display area between the first substrate 100 and the second substrate 200, and receives a signal from the wire 300 and emits light to thus display an image.

A configuration of an organic light emitting diode (OLED) display according to a first exemplary embodiment will now be described with reference to FIG. 2 thru FIG. 4.

Figure 2:
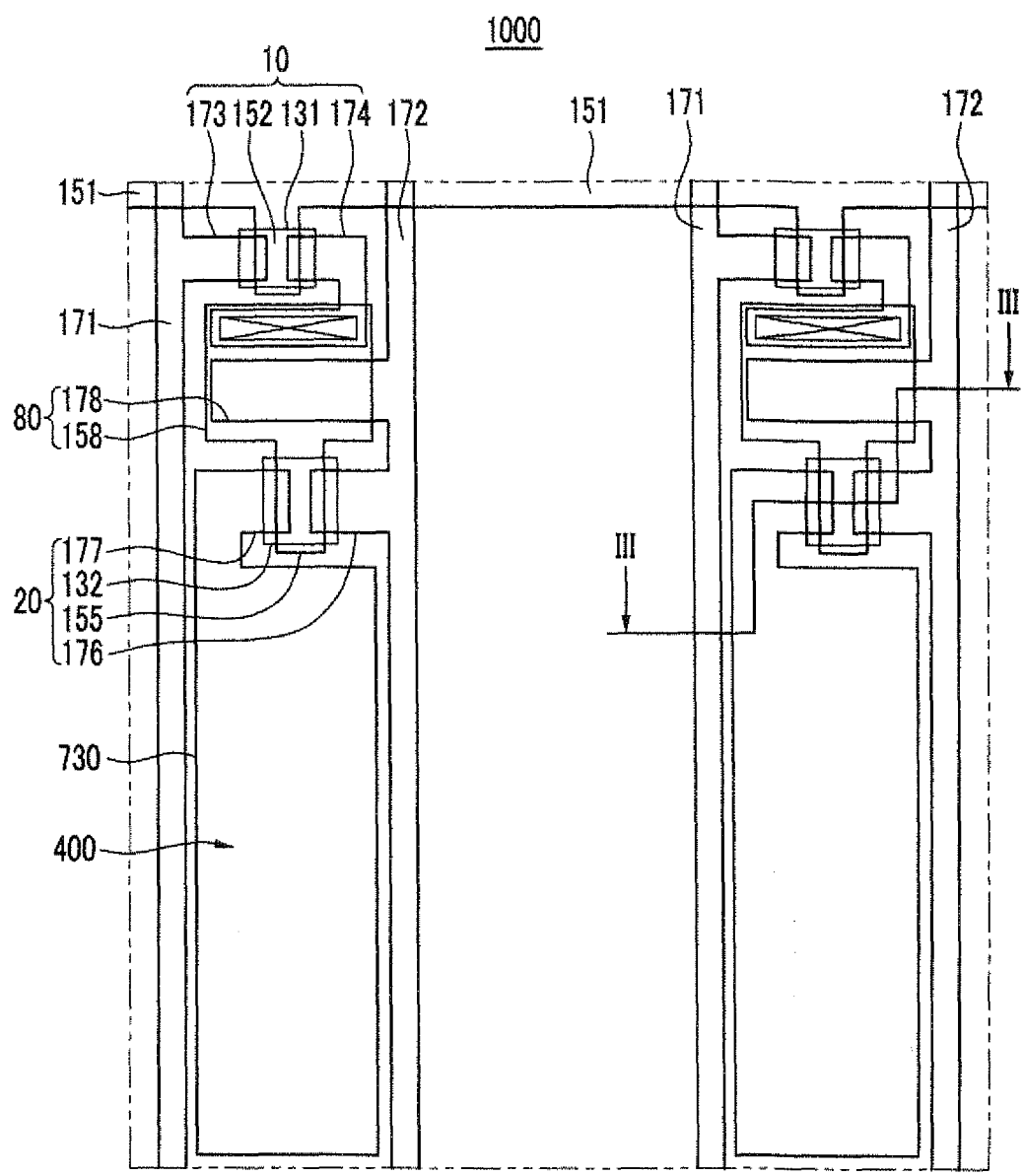
FIG. 2 is a layout view for showing a configuration of a pixel of an organic light emitting diode (OLED) display according to a first exemplary embodiment of the present invention.
Figure 3:
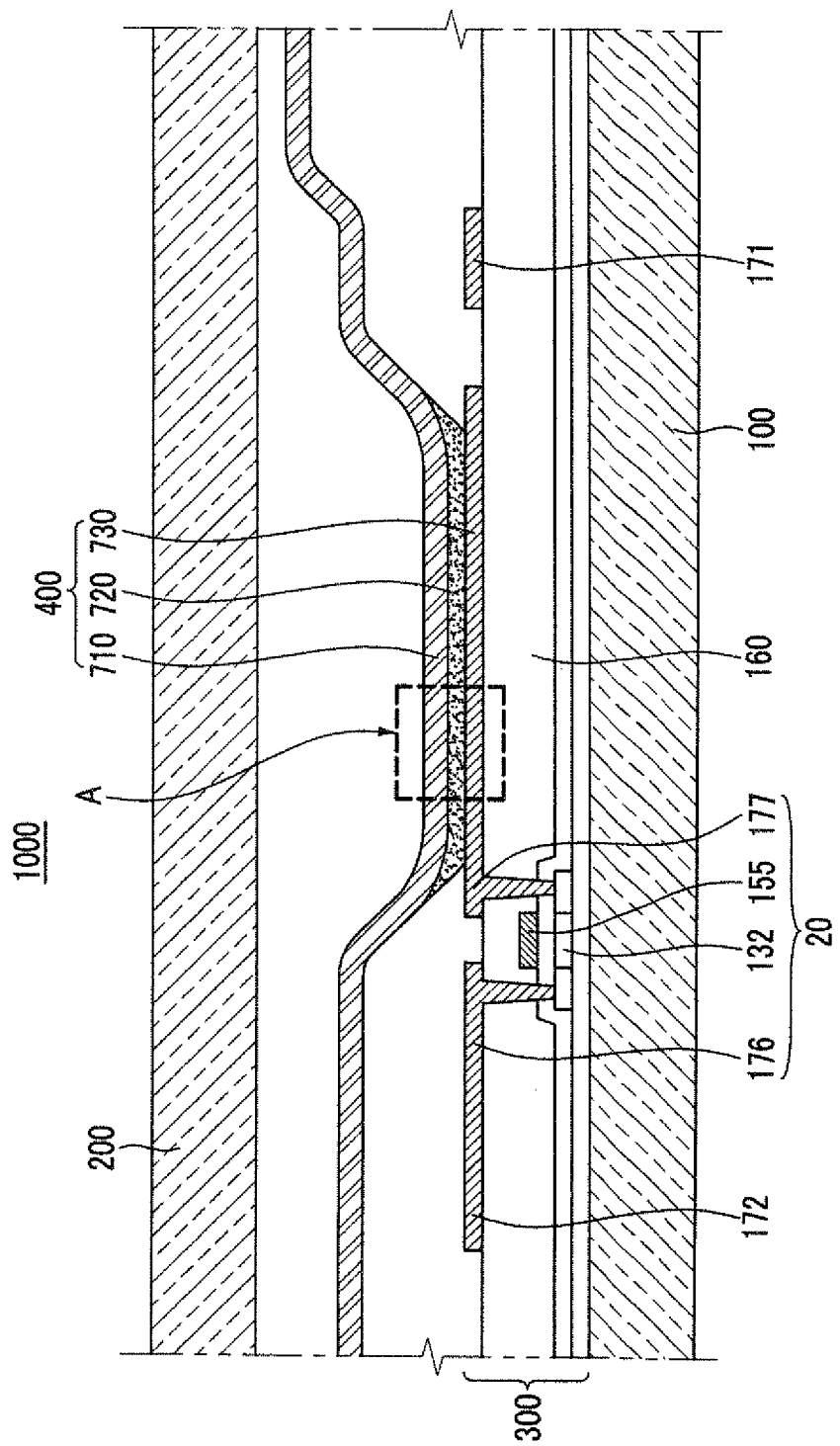
FIG. 3 is a cross-sectional view with respect to a line III-III of FIG. 2.

FIG. 2 is a layout view for showing a configuration of a pixel of an organic light emitting diode (OLED) display according to a first exemplary embodiment of the present invention, and FIG. 3 is a cross-sectional view with respect to a line III-III of FIG. 2.

Detailed configurations of the wire 300 and the organic light emitting element 400 are shown in FIG. 2 and FIG. 3, but the exemplary embodiment of the invention is not restricted to the configurations shown in FIG. 2 and FIG. 3. The wire 300 and the organic light emitting element 400 may be varied by a skilled person in the art within an easily modifiable range. For example, the attached drawing shows a 2Tr-1Cap type active matrix (AM) organic light emitting diode (OLED) display including two thin film transistors (TFTs) and a capacitor for each pixel as the display device, but the present invention is not limited thereto. Therefore, the number of thin film transistors, capacitors, and wires of the display device is not limited. The pixel is the minimum unit for displaying an image, and the display device displays the image through a plurality of pixels.

As shown in FIG. 2 and FIG. 3, the organic light emitting diode (OLED) display 1000 includes a switching thin film transistor 10, a driving thin film transistor 20, a capacitor 80, and an organic light emitting element 400 for each pixel. Here, the wire 300 includes the switching thin film transistor 10, the driving thin film transistor 20, and the capacitor 80. The wire 300 further includes a gate line 151 disposed in one direction of the first substrate 100, a data line 171 crossing the gate line 151 in an insulated manner, and a common power line 172. In this instance, one pixel can be configured by the boundaries of the gate line 151, the data line 171, and the common power line 172, but it is not limited thereto.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch for selecting the pixel to emit light. The switching gate electrode 152 is connected to the gate line 151. The switching source electrode 173 is connected to the data line 171. The switching drain electrode 174 is separately disposed from the switching source electrode 173 and is connected to a storage plate 158.

The driving thin film transistor 20 applies driving power for emitting the organic emission layer 720 of the organic light emitting element 400 within the selected pixel to the second electrode 730. The driving gate electrode 155 is connected to the storage plate 158 connected to the switching drain electrode 174. The driving source electrode 176 and the other storage plate 178 are connected to the common power line 172. The second electrode 730 of the organic light emitting element 400 is extended from the driving drain electrode 177, and the driving drain electrode 177 is connected to the second electrode 730.

The capacitor 80 includes a pair of storage plates 158 and 178 disposed with the interlayer insulating layer 160 therebetween. Here, the interlayer insulating layer 160 is formed of a dielectric material, and capacitance of the capacitor 80 is determined by the charges charged in the capacitor 80 and the voltage between the storage plates 158 and 178.

According to the above-noted configuration, the switching thin film transistor 10 is operated by a gate voltage applied to the gate line 151 to transmit a data voltage applied to the data line 171 to the driving thin film transistor 20. A voltage corresponding to a difference between a common voltage applied to the driving thin film transistor 20 from the common power line 172 and a data voltage transmitted by the switching thin film transistor 10 is stored in the capacitor 80, and a current corresponding to the voltage stored in the capacitor 80 flows to the organic light emitting element 400 through the driving thin film transistor 20 so as to cause the organic light emitting element 400 to emit light.

Referring to FIG. 3, the organic light emitting element 400 includes a first electrode 710, a second electrode 730 facing the first electrode 710, and an organic emission layer 720 provided between the first electrode 710 and the second electrode 730. That is, the second electrode 730, the organic emission layer 720, and the first electrode 710 are sequentially stacked on the first substrate 100.

Figure 4:
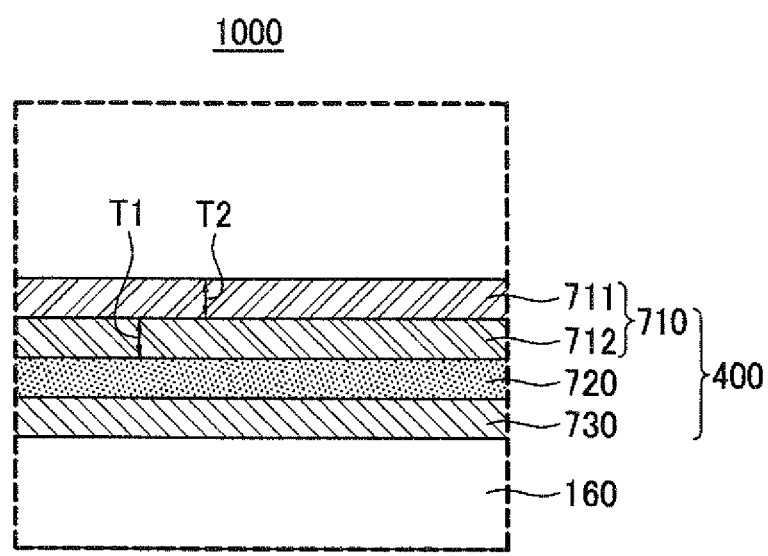
FIG. 4 is an enlarged view of the part A in FIG. 3.

FIG. 4 is an enlarged view of the part A in FIG. 3.

As shown in FIG. 4, the second electrode 730 includes a light opaque material, and is an anode, a hole injection electrode. The second electrode 730 includes a single-layered or multi-layered light opaque or light reflective conducting material including at least one of indium tin oxide (ITO), indium zinc oxide (IZO), and silver (Ag). The second electrode 730 is desirably made of a conducting material with a high work function compared to the first electrode 710 so that the hole injection capacity for the organic emission layer 720 may be high. The organic emission layer 720 is provided on the second electrode 730.

The organic emission layer 720 includes a main emission layer for emitting light, a hole organic layer provided between the main emission layer and the second electrode 730, and an electron organic layer provided between the main emission layer and the first electrode 710. The main emission layer combines holes and electrons injected by the second electrode 730 and the first electrode 710, respectively. The hole organic layer includes at least one of at least one hole injection layer (HIL) and at least one hole transport layer (HTL), and the electron organic layer includes at least one of at least one electron injection layer (EIL) and at least one electron transport layer (ETL). The main emission layer includes a red emission layer for emitting red light, a green emission layer for emitting green light, and a blue emission layer for emitting blue light. The first electrode 710, a cathode, is provided on the organic emission layer 720, and holes and electrons are injected into the organic emission layer 720 from the second electrode 730 and the first electrode 710 so that the organic emission layer 720 emits light when exitons, which are a combination of the holes and the electrons injected into the organic emission layer 720, enter a ground state from an excitation state.

The first electrode 710 has a mixed feature of optical absorption and light reflectivity, and is a cathode, an electron injection electrode. Accordingly, the organic light emitting element 400 emits light in a direction of the first substrate 100. That is, the organic light emitting diode (OLED) display 1000 is a rear light emission type device.

The first electrode 710 includes a conductive black layer 711 provided on the organic emission layer 720, and a first conductive layer 712 provided between the organic emission layer 720 and the conductive black layer 711.

The conductive black layer 711 comprises a light absorption material including silver sulfide ($Ag_2S$) generated by heat-treating silver (Ag) under a sulfur (S) atmosphere, and the first conductive layer 712 comprises a light reflective material including at least one of a magnesium silver alloy (MgAg), aluminum (Al), and silver (Ag). In detail, reflectance of the conductive black layer 711 is 0% to 10%, transmittance of the first conductive layer 712 is 10% to 99%, and reflectance of the conductive black layer 711 is less than reflectance of the first conductive layer 712.

Also, a second thickness T2 of the conductive black layer 711 is greater than a first thickness T1 of the first conductive layer 712. In detail, the second thickness T2 of the conductive black layer 711 can be 100 Å to 5000 Å, and the first thickness T1 of the first conductive layer 712 can be 10 Å to 500 Å.

Accordingly, since the first conductive layer 712 neighboring the organic emission layer 720 is thinner than the conductive black layer 711 separated from the organic emission layer 720 with the first conductive layer 712 therebetween, and transmittance of the first conductive layer 712 is simultaneously greater than transmittance of the conductive black layer 711, most light emitted by the organic emission layer 720, and applied to the first electrode 710 transmits through the first conductive layer 712 neighboring the organic emission layer 720 and is then absorbed by the conductive black layer 711 separated from the organic emission layer 720.

That is, light absorption capacity of the first electrode 710 depends on the conductive black layer 711, transmittance of the first conductive layer 712 is 10% to 99% so that most light emitted by the organic emission layer 720 and applied to the first electrode 710 transmits through the first conductive layer 712 so as to be applied to the conductive black layer 711, and reflectance of the conductive black layer 711 is 0% to 10% so that most light emitted by the organic emission layer 720 and applied to the conductive black layer 711 is absorbed by the conductive black layer 711.

The first conductive layer 712 can be made with a conducting material including at least one of a magnesium silver alloy (MgAg), aluminum (Al), and silver (Ag) having a lesser work function than the second electrode 730 so that the first electrode 710 may have a great electron injection capacity for the organic emission layer 720, and it contacts the organic emission layer 720 so as to substantially inject the electrons into the organic emission layer 720.

Accordingly, since the first conductive layer 712 for injecting the electrons into the organic emission layer 720 and the second electrode 730 for injecting the holes into the organic emission layer 720 face each other with the organic emission layer 720 therebetween in the organic light emitting element 400, the electrons and the holes are easily combined within the organic emission layer 720 so as to improve luminous efficiency of the organic emission layer 720.

Furthermore, the organic light emitting diode (OLED) display 1000 has the second electrode 730 as an anode and the first electrode 710 as a cathode, but the organic light emitting diode (OLED) display according to another exemplary embodiment can have the second electrode as a cathode and the first electrode as an anode. In this case, the first conductive layer of the first electrode has a conductive material with a great work function compared to the second electrode, so that it is desirable to realize the first electrode having a great hole injection capacity.

Therefore, since the second electrode 730 of the organic light emitting element 400 is light-opaque and the first electrode 710 includes the conductive black layer 711 with the light absorption feature in the organic light emitting diode (OLED) display 1000 according to the first exemplary embodiment, the outer light applied to the first electrode 710 from the outside through the first substrate 100 and the light emitted by the organic emission layer 720 and applied to the first electrode 710 are absorbed into the conductive black layer 711, respectively, so that the organic light emitting element 400 is not seen from the outside. That is, since contours of the first electrode 710 and the second electrode 730 configuring the organic light emitting element 400 are not viewable in the image displayed by the organic light emitting element 400, reflection of outer light by the organic light emitting element 400 is suppressed to thereby improve display quality of the image displayed by the organic light emitting diode (OLED) display 1000.

Also, since no polarizing plate for suppressing reflection of the outer light is attached on the first substrate 100 through which the light emitted by the organic light emitting element 400 is transmitted in the organic light emitting diode (OLED) display 1000, luminance of the light emitted by the organic light emitting element 400 is not deteriorated by the polarizing plate, and the display quality of the image displayed by the organic light emitting diode (OLED) display 1000 is improved.

Furthermore, in the organic light emitting diode (OLED) display 1000, since the conductive black layer 711 has conductivity as well as the light absorption feature, resistance of the first electrode 710 including the first conductive layer 712 and the conductive black layer 711 is reduced compared to the electrode which has the first conductive layer 712, and delay of the current, which is a signal for emitting the organic emission layer 720 within the first electrode 710, is suppressed. That is, since the current, the signal for emitting the organic emission layer 720, flows fluently in the first electrode 710, efficiency of the light emitted by the organic emission layer 720 is improved so as to thereby improve the display quality of the organic light emitting diode (OLED) display 1000.

Figure 5C:
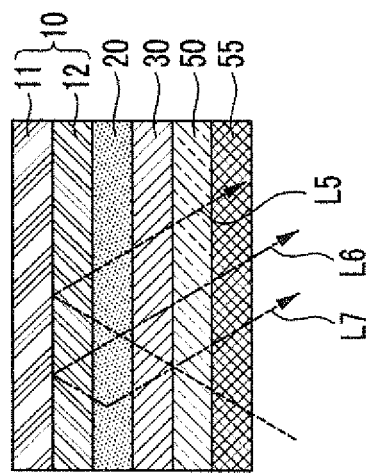
FIGS. 5A-5C are cross-sectional views of major constituent elements in an organic light emitting diode (OLED) display according to a first experimental example, a first comparative example, and a second comparative example, respectively, of the present invention.
Figure 5B:
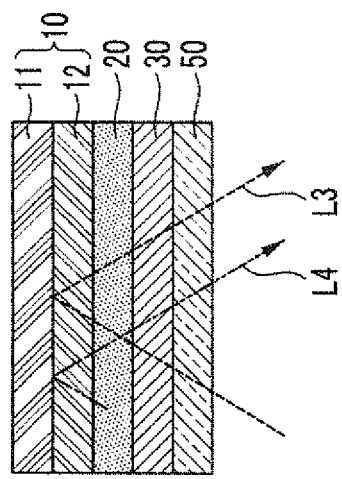
Figure 5A:
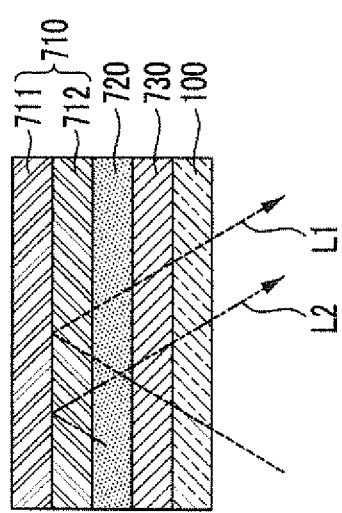

FIGS. 5A thru 5C are cross-sectional views of major constituent elements in an organic light emitting diode (OLED) display according to a first experimental example, a first comparative example, and a second comparative example, respectively, of the present invention.

FIGS. 5A thru 5C show major constituent elements through which the light is transmitted in the organic light emitting diode (OLED) display for a better understanding and ease of description.

Referring to FIGS. 5A thru 5C, a first experimental example for checking the suppressed state of reflection of the outer light by the organic light emitting diode (OLED) display 1000 according to a first exemplary embodiment of the invention will now be described.

First, FIG. 5A shows a cross-sectional view of an organic light emitting diode (OLED) display according to the first experimental example. The organic light emitting diode (OLED) display according to the first experimental example includes a first substrate 100, a second electrode 730, an organic emission layer 720, and a first electrode 710 including a first conductive layer 712 and a conductive black layer 711.

In the first experimental example, the first substrate 100 includes glass and has optical transmittance of 98%, the second electrode 730 includes indium tin oxide (ITO) and has optical transmittance of 95%, the organic emission layer 720 includes an organic material and has optical transmittance of 90%, the first conductive layer 712 includes a magnesium silver alloy (MgAg) and has optical transmittance of 80%, and the conductive black layer 711 includes silver sulfide ($Ag_2S$) and has optical reflectance of 5%.

When first light L1, outer light, is irradiated to the organic light emitting diode (OLED) display according to the first experimental example from the outside in the direction of the first electrode 710, the first light L1 is transmitted through the first substrate 100, the second electrode 730, the organic emission layer 720 and the first conductive layer 712, it is reflected by the conductive black layer 711, it is again transmitted through the first conductive layer 712, the organic emission layer 720, the second electrode 730 and the first substrate 100, and it is irradiated to the outside. When the optical reflectance of the first light L1, the outer light applied to the organic light emitting diode (OLED) display from the outside through the above-noted path, reflected by the first electrode 710, and seen from the outside, is calculated, 2.2% of the optical reflectance is obtained, from Equation 1.

$$0.98*0.95*0.90*0.80*0.05*0.80*0.90*0.95*0.98*100=2.2 \quad \text{Equation 1}$$

That is, it is determined that 2.2% of the first light L1, the outer light inputted to the organic light emitting diode (OLED) display according to the first experimental example, is irradiated to the outside so that reflection of the outer light of the organic light emitting diode (OLED) display according to the first experimental example is suppressed.

In addition, in the organic light emitting diode (OLED) display, when the second light L2, inner light, is emitted by the organic emission layer 720 and is irradiated in the direction of the conductive black layer 711, the second light L2 is transmitted through the organic emission layer 720 and the first conductive layer 712, is reflected by the conductive black layer 711, is again transmitted through the first conductive layer 712, the organic emission layer 720, the second electrode 730 and the first substrate 100, and is then irradiated to the outside. When the optical reflectance of the second light L2, inner light emitted by the organic emission layer 720 through the above-noted path, irradiated in the direction of the conductive black layer 711, reflected by the conductive black layer 711, and seen from the outside is calculated, 2.4% of optical reflectance is acquired from Equation 2.

$$0.90*0.80*0.05*0.80*0.90*0.95*0.98*100=2.4 \quad \text{Equation 2}$$

That is, it is determined that 2.4% of the second light L2, the inner light, emitted by the organic emission layer 720 of the organic light emitting diode (OLED) display according to the first experimental example, reflected by the conductive black layer 711, and seen from the outside, is irradiated to the outside.

As described, it is found that 2.2% of the first light L1, the outer light inputted to the organic light emitting diode (OLED) display from the outside, is visible from the outside, and 2.4% of the second light L2, the inner light emitted by the organic emission layer 720, is seen from the outside. That is, it is determined that most of the first light L1 and the second light L2 is absorbed by the conductive black layer 711 so that display quality of the image displayed by the organic emission layer 720 is improved.

FIG. 5B shows a cross-sectional view of an organic light emitting diode (OLED) display according to a first comparative example. The organic light emitting diode (OLED) display includes a comparative substrate 50, a comparative second electrode 30, a comparative organic emission layer 20, and a comparative first electrode 10 including a comparative first conductive layer 12 and a reflective conductive layer 11.

In the first comparative example, the comparative substrate 50 includes glass and has optical transmittance of 98%, the comparative second electrode 30 includes indium tin oxide (ITO) and has optical transmittance of 95%, the comparative organic emission layer 20 includes an organic material and has optical transmittance of 90%, the comparative first conductive layer 12 includes a magnesium silver alloy (MgAg) and has optical transmittance of 80%, and the reflective conductive layer 11 includes silver (Ag) and has optical reflectance of 98%.

When third light L3, outer light, is irradiated to the organic light emitting diode (OLED) display in the direction of the comparative first electrode 10 from the outside, the third light L3 is transmitted through the comparative substrate 50, the comparative second electrode 30, the comparative organic emission layer 20 and the comparative first conductive layer 12 from the outside, is reflected by the reflective conductive layer 11, is transmitted through the comparative first conductive layer 12, the comparative organic emission layer 20, the comparative second electrode 30 and the comparative substrate 50, and is irradiated to the outside. When the optical reflectance of the third light L3, outer light inputted to the organic light emitting diode (OLED) display from the outside, through the above-noted path, reflected by the comparative first electrode 10, and seen from the outside is calculated, 44% of optical reflectance is found from Equation 3.

$$0.98*0.95*0.90*0.80*0.98*0.80*0.90*0.95*0.98*100=44 \quad \text{Equation 3}$$

That is, 44% of the third light L3, outer light inputted to the organic light emitting diode (OLED) display according to the first comparative example, is irradiated to the outside so that the form of the comparative first electrode 10 is seen from the outside in the organic light emitting diode (OLED) display according to the first comparative example.

Also, when fourth light L4, inner light emitted from the comparative organic emission layer 20 of the organic light emitting diode (OLED) display according to the first comparative example, is irradiated in the direction of the reflective conductive layer 11, the fourth light L4 is transmitted through the comparative organic emission layer 20 and the comparative first conductive layer 12, is reflected by the reflective conductive layer 11, is transmitted through the comparative first conductive layer 12, the comparative organic emission layer 20, the comparative second electrode 30 and the comparative substrate 50, and is irradiated to the outside. When the optical reflectance of the fourth light L4, inner light emitted by the comparative organic emission layer 20 through the above-noted path, irradiated in the direction of the reflective conductive layer 11, reflected by the reflective conductive layer 11, and seen from the outside, is calculated, 47.3% of optical reflectance is produced from Equation 4.

$$0.90*0.80*0.98*0.80*0.90*0.95*0.98*100=47.3 \quad \text{Equation 4}$$

That is, it is determined that 47.3% of the fourth light L4, inner light emitted by the comparative organic emission layer 20 of the organic light emitting diode (OLED) display according to the first comparative example, reflected by the reflective conductive layer 11, and seen from the outside, is irradiated to the outside so that it is found that the form of the comparative first electrode 10 is seen from the outside in the organic light emitting diode (OLED) display according to the first comparative example.

Accordingly, 44% of the third light L3, outer light inputted to the organic light emitting diode (OLED) display, is visible from the outside, and 47.3% of the fourth light L4, inner light emitted by the comparative organic emission layer 20, is seen from the outside. That is, since halves of the third light L3 and the fourth light L4 are reflected by the reflective conductive layer 11 and are seen from the outside, it is determined that the form of the first electrode 710 is visible from the outside and the display quality of the image displayed by the comparative organic emission layer 20 is deteriorated.

FIG. 5C shows a cross-sectional view of an organic light emitting diode (OLED) display according to a second comparative example. The organic light emitting diode (OLED) display according to the second comparative example includes a comparative substrate 50, a comparative second electrode 30, a comparative organic emission layer 20, a comparative first electrode 10 including a comparative first conductive layer 12 and a reflective conductive layer 11, and a polarizing plate 55 attached to the comparative substrate 50.

In the second comparative example, the comparative substrate 50 includes glass and has optical transmittance of 98%, the comparative second electrode 30 includes indium tin oxide (ITO) and has optical transmittance of 95%, the comparative organic emission layer 20 includes an organic material and has optical transmittance of 90%, the comparative first conductive layer 12 includes a magnesium silver alloy (MgAg) and has optical transmittance of 80%, the reflective conductive layer 11 includes silver (Ag) and has optical reflectance of 98%, and the polarizing plate 55 has optical transmittance of 45%.

When fifth light L5, outer light, is irradiated to the organic light emitting diode (OLED) display according to the second comparative example from the outside in the direction of the comparative first electrode 10, the fifth light L5 is passed through the polarizing plate 55 from the outside so as to have a first optical axis possessed by the polarizing plate 55, is transmitted through the comparative substrate 50, the comparative second electrode 30 the comparative organic emission layer 20 and the comparative first conductive layer 12, is reflected by the reflective conductive layer 11, has a second optical axis in the opposite direction of the first optical axis, is again transmitted through the comparative first conductive layer 12, the comparative organic emission layer 20, the comparative second electrode 30, and the comparative substrate 50, and is absorbed by the polarizing plate 55. That is, the fifth light L5, outer light, is applied to the organic light emitting diode (OLED) display from the outside and is reflected by the comparative first electrode 10 so that most of fifth light L5 is absorbed by the polarizing plate 55. Accordingly, reflection of outer light of the organic light emitting diode (OLED) display according to the second comparative example is prevented by the polarizing plate 55.

Also, when sixth light L6, inner light, is emitted by the comparative organic emission layer 20 in the organic light emitting diode (OLED) display according to the second comparative example and is irradiated in the direction of the reflective conductive layer 11, the sixth light L6 is transmitted through the comparative organic emission layer 20 and the comparative first conductive layer 12, is reflected by the reflective conductive layer 11, is again transmitted through the comparative first conductive layer 12, the comparative organic emission layer 20, the comparative second electrode 30, the comparative substrate 50 and the polarizing plate 55, and is irradiated to the outside. When the optical reflectance of the sixth light L6, inner light emitted by the comparative organic emission layer 20 through the above-noted path, irradiated in the direction of the reflective conductive layer 11, reflected by the reflective conductive layer 11, and seen from the outside, is calculated, 21.3% of optical reflectance is acquired from Equation 5.

$$0.90*0.80*0.98*0.80*0.90*0.95*0.98*0.45*100=21.3 \quad \text{Equation 5}$$

That is, it is determined that 21.3% of the sixth light L6, inner light emitted by the comparative organic emission layer 20 of the organic light emitting diode (OLED) display according to the second comparative example, reflected by the reflective conductive layer 11, and seen from the outside, is irradiated to the outside, and it is found that the form of the comparative first electrode 10 is seen from the outside in the organic light emitting diode (OLED) display according to the second comparative example.

Also, when seventh light L7 is emitted by the comparative organic emission layer 20 and is irradiated in the direction of the comparative substrate 50 in the organic light emitting diode (OLED) display according to the second comparative example, 55% of luminance of the seventh light L7 is reduced while passing through the polarizing plate 55 because the polarizing plate 55 has optical transmittance of 45%. That is, luminance of the image is reduced by the light emitted by the comparative organic emission layer 20.

As described, regarding the organic light emitting diode (OLED) display according to the second comparative example, the fifth light L5, outer light applied to the organic light emitting diode (OLED) display from the outside, is reflected by the reflective conductive layer 11 and is absorbed by the polarizing plate 55, 21.3% of the sixth light L6, inner light emitted by the comparative organic emission layer 20 is visible from the outside, and 55% of luminance of the seventh light L7, emitted by the comparative organic emission layer 20, is reduced while passing through the polarizing plate 55. That is, reflection of the outer light is prevented since the fifth light L5, outer light, is not seen from the outside in the organic light emitting diode (OLED) display according to the second comparative example, part of the sixth light L6, inner light, is reflected by the reflective conductive layer 11 and is seen from the outside, and 55% of luminance of the seventh light L7 is reduced so that the form of the first electrode 710 is visible from the outside and the entire luminance is simultaneously reduced so as to determine that the display quality of the image displayed by the comparative organic emission layer 20 is deteriorated.

As described above, in a comparison of the organic light emitting diode (OLED) display according to the first experimental example of the present invention with the respective organic light emitting diode (OLED) displays according to the first comparative example and the second comparative example, the organic light emitting diode (OLED) display according to the first experimental example of the present invention suppresses reflection of the inner light and the outer light and improves display quality more than the organic light emitting diode (OLED) displays according to the first comparative example and the second comparative example.

As determined from the first experimental example of the present invention, the organic light emitting diode (OLED) display 1000 according to the first exemplary embodiment suppresses reflection of the inner light as well as reflection of the outer light so as to thereby improve the display quality of the image displayed by the organic light emitting element 400.

Figure 6:
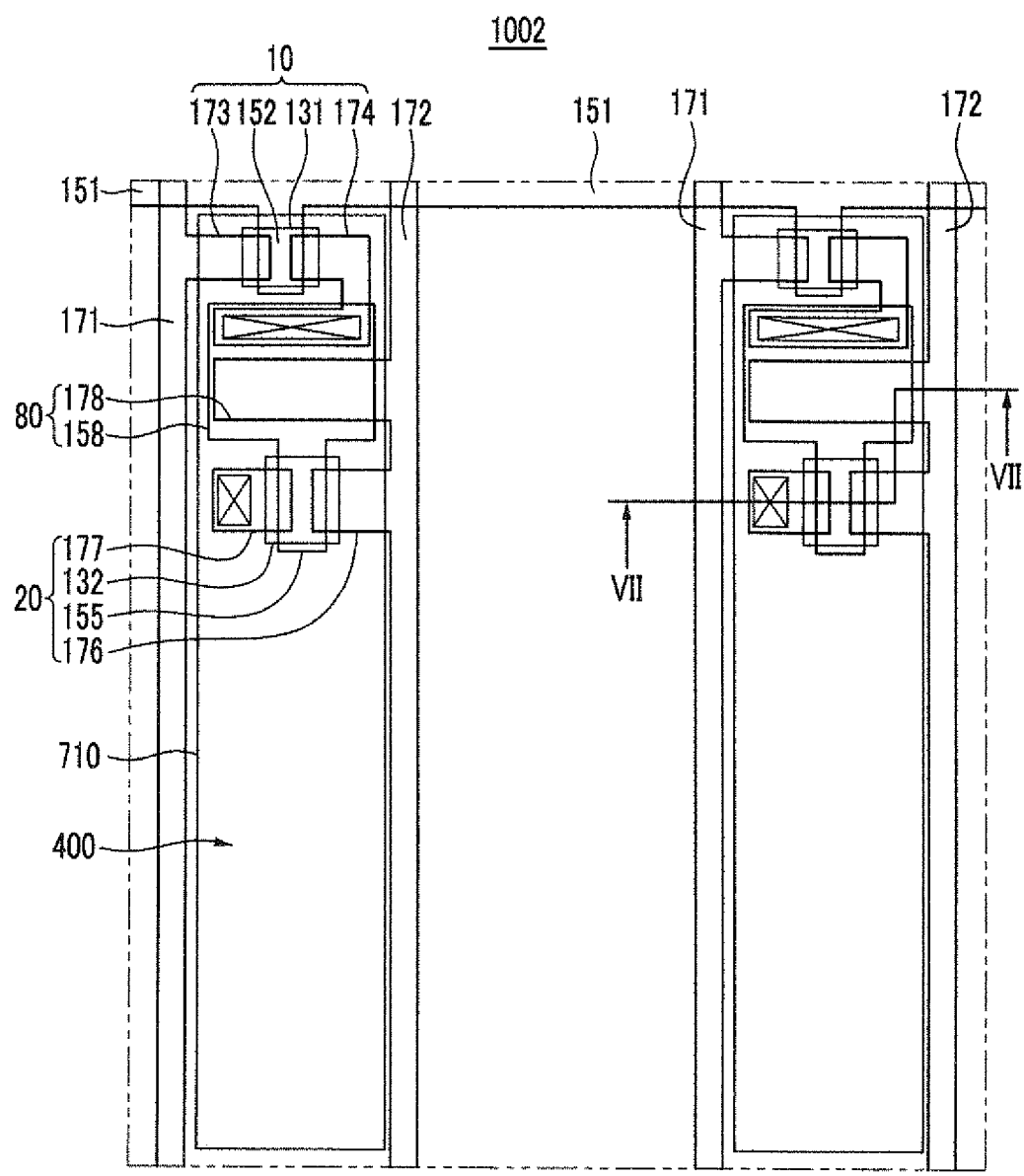
FIG. 6 is a layout view for showing a configuration of a pixel of an organic light emitting diode (OLED) display according to a second exemplary embodiment of the present invention.
Figure 7:
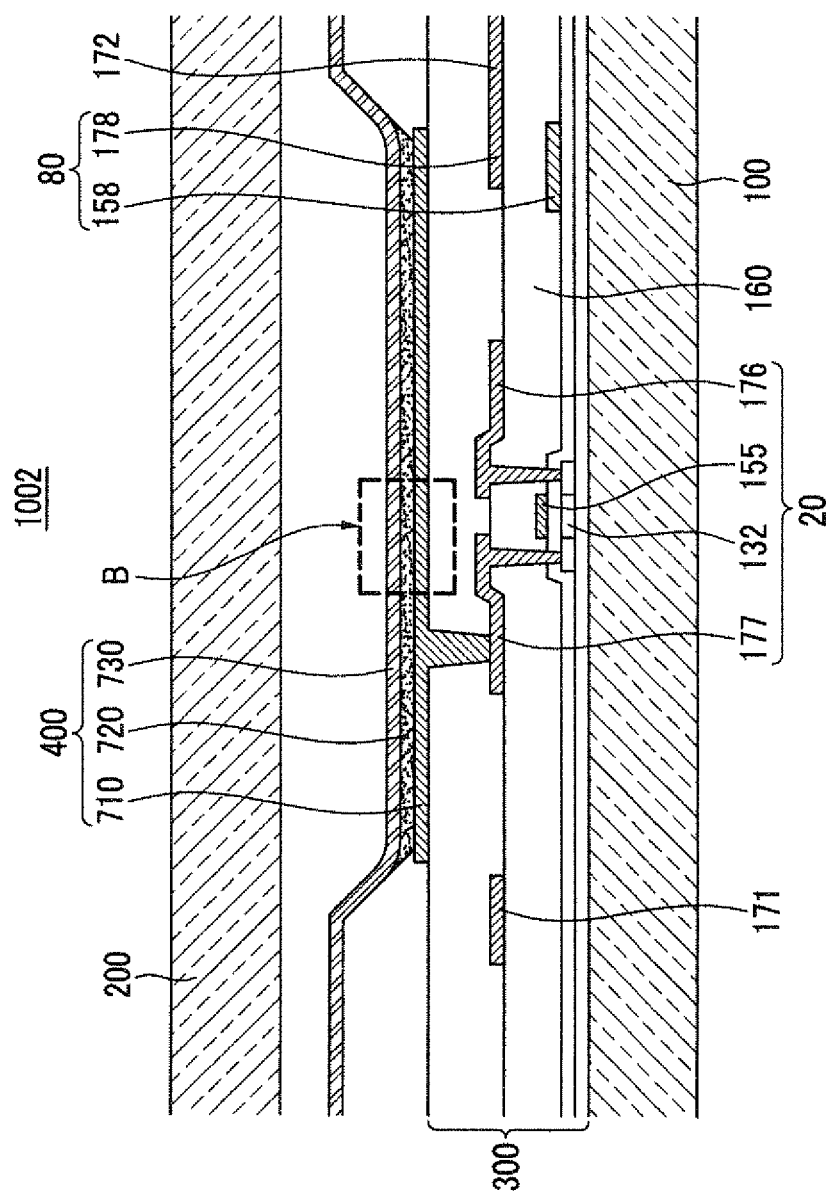
FIG. 7 is a cross-sectional view with respect to a line VII-VII of FIG. 6.
Figure 8:
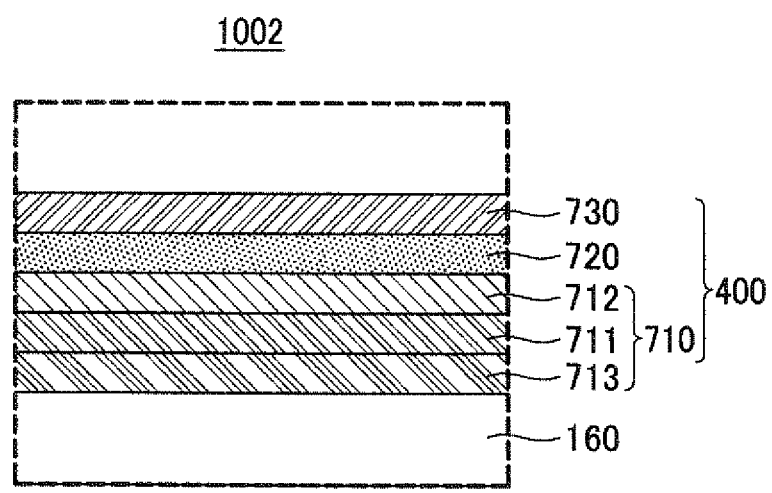
FIG. 8 is an enlarged view of the part B of FIG. 7.

Referring to FIG. 6 thru FIG. 8, a configuration of an organic light emitting diode (OLED) display according to a second exemplary embodiment will now be described.

FIG. 6 is a layout view for showing a configuration of a pixel of an organic light emitting diode (OLED) display according to a second exemplary embodiment of the invention, and FIG. 7 is a cross-sectional view with respect to a line VII-VII of FIG. 6.

As shown in FIG. 6 and FIG. 7, in the organic light emitting diode (OLED) display 1002, the driving drain electrode 177 is connected to the first electrode 710 of the organic light emitting element 400 through a contact hole.

The organic light emitting element 400 includes a first electrode 710, a second electrode 730 facing the first electrode 710, and an organic emission layer 720 provided between the first electrode 710 and the second electrode 730. That is, the first electrode 710, the organic emission layer 720, and the second electrode 730 are sequentially stacked on the first substrate 100.

FIG. 8 is an enlarged view of the part B of FIG. 7.

As shown in FIG. 8, the second electrode 730 includes a light-reflective material, and is a cathode, an electron injection electrode. The second electrode 730 comprises a single-layered or multi-layered light reflective conducting material including at least one of a magnesium silver alloy (MgAg), aluminum (Al), and silver (Ag). The second electrode 730 is desirably made of a conducting material with a lesser work function than the first electrode 710 so that the electron injection capacity for the organic emission layer 720 may be great. The organic emission layer 720 is provided below the second electrode 730.

The organic emission layer 720 includes a main emission layer for emitting light, a hole organic layer provided between the main emission layer and the first electrode 710, and an electron organic layer provided between the main emission layer and the second electrode 730. The main emission layer combines holes and electrons injected by the first electrode 710 and the second electrode 730, respectively, the hole organic layer includes at least one of at least one hole injection layer (HIL) and at least one hole transport layer (HTL), and the electron organic layer includes at least one of at least one electron injection layer (EIL) and at least one electron transport layer (ETL). The main emission layer includes a red emission layer for emitting red light, a green emission layer for emitting green light, and a blue emission layer for emitting blue light. The first electrode 710, an anode, is provided below the organic emission layer 720, and the organic emission layer 720 emits light when the holes and the electrons are injected to the organic emission layer 720 from the first electrode 710 and the second electrode 730, and exitons, combinations of the holes and the electrons, are changed into a ground state from an excitation state.

The first electrode 710 has a mixed feature of optical absorption and light reflectivity, and is an anode, a hole injection electrode. Accordingly, the organic light emitting element 400 emits light in a direction of the second substrate 200. That is, the organic light emitting diode (OLED) display 1002 is a front light emission type device.

The first electrode 710 includes a conductive black layer 711 provided below the organic emission layer 720, a first conductive layer 712 provided between the organic emission layer 720 and the conductive black layer 711, and a second conductive layer 713 separated from the organic emission layer 720 and the first conductive layer 712 with the conductive black layer 711 therebetween.

The conductive black layer 711 comprises a light absorption material including silver sulfide ($Ag_2S$), and the first conductive layer 712 comprises a light opaque material including at least one of indium tin oxide (ITO) and indium zinc oxide (IZO). The second conductive layer 713 comprises a light reflecting material including silver (Ag). The conductive black layer 711 can be formed by heat treating the second conductive layer 713 under a sulfur atmosphere, and can be formed as a thin film on the second conductive layer 713.

Accordingly, the first electrode 710 comprises the conductive black layer 711 including silver sulfide so that most light emitted by the organic emission layer 720 and irradiated to the first electrode 710 is transmitted through the first conductive layer 712 neighboring the organic emission layer 720, and is absorbed by the conductive black layer 711 separated from the organic emission layer 720.

The first conductive layer 712 is made of a conducting material including at least one of indium tin oxide (ITO) and indium zinc oxide (IZO) with a greater work function than the second electrode 730 so that the first electrode 710 may have great hole injection capacity for the organic emission layer 720, and it contacts the organic emission layer 720 so as to substantially inject the holes into the organic emission layer 720.

Accordingly, since the first conductive layer 712 for injecting the holes to the organic emission layer 720 faces the second electrode 730 for injecting the electrons to the organic emission layer 720 with the organic emission layer 720 therebetween in the organic light emitting element 400, the holes and the electrons are easily combined within the organic emission layer 720 so as to improve luminous efficiency of the organic emission layer 720. Hence, since the second electrode 730 of the organic light emitting element 400 includes a light opaque material and the first electrode 710 includes the light-absorbing conductive black layer 711 in the organic light emitting diode (OLED) display 1002 according to the second exemplary embodiment, the outer light irradiated to the first electrode 710 from the outside through the second substrate 200 and the light emitted by the organic emission layer 720 and irradiated to the first electrode 710 are absorbed in the conductive black layer 711 so that the organic light emitting element 400 is not seen from the outside. That is, the contours of the first electrode 710 and the second electrode 730 configuring the organic light emitting element 400 are not seen from the image displayed by the organic light emitting element 400 so that reflection of the outer light by the organic light emitting element 400 is suppressed, thus improving the display quality of the image displayed by the organic light emitting diode (OLED) display 1002.

Also, the organic light emitting diode (OLED) display 1002 according to the second exemplary embodiment has no polarizing plate for suppressing the reflection of the outer light attached to the second substrate 200 through which the light emitted by the organic light emitting element 400 is transmitted, so that the luminance of light emitted by the organic light emitting element 400 is not deteriorated by a polarizing plate, and the display quality of the image displayed by the organic light emitting diode (OLED) display 1002 is improved.

Furthermore, the conductive black layer 711 has conductivity in addition to the light absorption feature, and resistance of the first electrode 710, including the first conductive layer 712 and the conductive black layer 711, is reduced compared to the electrode including the first conductive layer 712, so thay delay of the current, a signal for emitting the organic emission layer 720 within the first electrode 710, is suppressed. That is, the current, the signal for emitting the organic emission layer 720, flows fluently within the first electrode 710 so that efficiency of the light emitted by the organic emission layer 720 is improved, and the display quality of the organic light emitting diode (OLED) display 1002 is improved.

FIGS. 9A thru 9C are a cross-sectional views of major constituent elements in an organic light emitting diode (OLED) display according to a second experimental example, a third comparative example, and a fourth comparative example, respectively, of the present invention.

FIGS. 9A thru 9C show major constituent elements through which the light is transmitted in the organic light emitting diode (OLED) display for better understanding and ease of description.

Referring to FIGS. 9A thru 9C, a second experimental example for determining the reflection suppression of outer light by the organic light emitting diode (OLED) display 1002 according to a second exemplary embodiment will be described.

FIG. 9A is a cross-sectional view of an organic light emitting diode (OLED) display according to a second experimental example. The organic light emitting diode (OLED) display includes a first electrode 710 including a second conductive layer 713, a conductive black layer 711 and a first conductive layer 712, an organic emission layer 720, a second electrode 730, and a second substrate 200.

In the second experimental example, the second conductive layer 713 includes silver (Ag) and has optical reflectance of 98%, the conductive black layer 711 includes $Ag_2S$ and has optical reflectance of 5%, the first conductive layer 712 includes indium tin oxide (ITO) and has optical transmittance of 95%, the organic emission layer 720 includes an organic material and has optical transmittance of 90%, the second electrode 730 includes a magnesium silver alloy (MgAg) and has optical transmittance of 50%, and the second substrate 200 includes glass and has optical transmittance of 98%.

When eighth light L8, outer light, is irradiated in the direction of the first electrode 710 to the organic light emitting diode (OLED) display according to the second experimental example from the outside, the eighth light L8 is transmitted through the second substrate 200, the second electrode 730, the organic emission layer 720 and the first conductive layer 712 from the outside, is reflected by the conductive black layer 711, is transmitted through the first conductive layer 712, the organic emission layer 720, the second electrode 730 and the second substrate 200, and is irradiated to the outside. When the optical reflectance of the eighth light L8, outer light inputted to the organic light emitting diode (OLED) display from the outside through the above-noted path, reflected by the first electrode 710, and seen from the outside, is calculated, optical reflectance of 0.9% is generated from Equation 6.

$$0.98*0.50*0.90*0.95*0.05*0.95*0.90*0.50*0.98*100=0.9 \quad \text{Equation 6}$$

That is, it is determined that 0.9% of the eighth light L8, outer light inputted to the organic light emitting diode (OLED) display according to the second experimental example, is irradiated to the outside so that it is found that reflection of the outer light by the organic light emitting diode (OLED) display according to the second experimental example is suppressed.

Furthermore, when ninth light L9, inner light, is emitted by the organic emission layer 720 and is irradiated in the direction of the conductive black layer 711 in the organic light emitting diode (OLED) display according to the second experimental example, the ninth light L9 is transmitted through the organic emission layer 720 and the first conductive layer 712, is reflected by the conductive black layer 711, is transmitted through the first conductive layer 712, the organic emission layer 720, the second electrode 730 and the second substrate 200, and is irradiated to the outside. When the optical reflectance of the ninth light L9, inner light emitted by the organic emission layer 720 through the above-noted path, irradiated in the direction of the conductive black layer 711, reflected by the conductive black layer 711, and seen from the outside, is calculated, optical reflectance of 1.8% is acquired from Equation 7.

$$0.90*0.95*0.05*0.95*0.90*0.50*0.98*100=1.8 \quad \text{Equation 7}$$

That is, it is determined that 1.8% of the ninth light L9, inner light emitted by the organic emission layer 720 of the organic light emitting diode (OLED) display according to the second experimental example, reflected by the conductive black layer 711, and seen from the outside, is irradiated to the outside.

Accordingly, regarding the organic light emitting diode (OLED) display according to the second experimental example of the present invention, it is found that 0.9% of the eighth light L8, outer light inputted to the organic light emitting diode (OLED) display from the outside, is visible from the outside, and 1.8% of the ninth light L9, inner light emitted by the organic emission layer 720, is seen from the outside. That is, most of the eighth light L8 and the ninth light L9 is absorbed by the conductive black layer 711 so that the display quality of the image displayed by the organic emission layer 720 is improved.

FIG. 9B is a cross-sectional view of an organic light emitting diode (OLED) display according to a third comparative example. The organic light emitting diode (OLED) display comprises a comparative first electrode 60 including a comparative second conductive layer 61 and a comparative first conductive layer 62, a comparative organic emission layer 70, a comparative second electrode 80, and a comparative substrate 90.

In the third comparative example, the comparative second conductive layer 61 includes silver (Ag) and has optical reflectance of 98%, the comparative first conductive layer 62 includes indium tin oxide (ITO) and has optical transmittance of 95%, the comparative organic emission layer 70 includes an organic material and has optical transmittance of 90%, the comparative second electrode 80 includes a magnesium silver alloy (MgAg) and has optical transmittance of 50%, and the comparative substrate 90 includes glass and has of optical transmittance of 98%.

When tenth light L10, outer light, is irradiated to the organic light emitting diode (OLED) display according to the third comparative example from the outside in the direction of the comparative first electrode 60, the tenth light L10 is transmitted through the comparative substrate 90, the comparative second electrode 80, the comparative organic emission layer 70 and the comparative first conductive layer 62 from the outside, is reflected by the comparative second conductive layer 61, is transmitted through the comparative first conductive layer 62, the comparative organic emission layer 70, the comparative second electrode 80 and the comparative substrate 90, and is irradiated to the outside. When the optical reflectance of the tenth light L10, outer light applied to the organic light emitting diode (OLED) display from the outside through the above-noted path, reflected by the comparative first electrode 60, and seen from the outside, is calculated, 17.2% of optical reflectance is acquired from Equation 8.

$$0.98*0.50*0.90*0.95*0.98*0.95*0.90*0.50*0.98*100=17.2 \quad \text{Equation 8}$$

That is, it is determined that 17.2% of the tenth light L10, outer light inputted to the organic light emitting diode (OLED) display according to the third comparative example, is irradiated to the outside so that it is found that the form of the comparative first electrode 60 is seen from the outside.

Also, when eleventh light L11, inner light, is emitted by the comparative organic emission layer 70 of the organic light emitting diode (OLED) display according to the third comparative example and is irradiated in the direction of the comparative second conductive layer 61, the eleventh light L11 is transmitted through the comparative organic emission layer 70 and the comparative first conductive layer 62, is reflected by the comparative second conductive layer 61, is transmitted through the comparative first conductive layer 62, the comparative organic emission layer 70, the comparative second electrode 80 and the comparative substrate 90, and is irradiated to the outside. When the optical reflectance of the eleventh light L11, inner light emitted by the comparative organic emission layer 70 through the above-noted path, irradiated in the direction of the comparative second conductive layer 61, reflected by the comparative second conductive layer 61, and seen from the outside, is calculated, 35.1% of optical reflectance is acquired from Equation 9.

$$0.90*0.95*0.98*0.95*0.90*0.50*0.98*100=35.1 \quad \text{Equation 9}$$

That is, it is determined that 35.1% of the eleventh light L11, inner light emitted by the comparative organic emission layer 70 of the organic light emitting diode (OLED) display according to the third comparative example, reflected by the comparative second conductive layer 61, and seen from the outside, is irradiated to the outside so that it is found that the form of the comparative first electrode 60 is seen from the outside.

Accordingly, regarding the organic light emitting diode (OLED) display according to the third comparative example, it is found that 17.2% of the tenth light L10, outer light inputted to the organic light emitting diode (OLED) display from the outside, is seen from the outside, and 35.1% of the eleventh light L11, inner light emitted by the comparative organic emission layer 70, is seen from the outside. That is, it is determined that, since predetermined parts of the tenth light L10 and the eleventh light L11 are reflected by the comparative second conductive layer 61 and are seen from the outside, the form of the first electrode 710 is seen from the outside, and the display quality of the image displayed by the comparative organic emission layer 70 is deteriorated.

FIG. 9C is a cross-sectional view of an organic light emitting diode (OLED) display according to a fourth comparative example. The organic light emitting diode (OLED) display comprises a comparative first electrode 60 including a comparative second conductive layer 61 and a comparative first conductive layer 62, a comparative organic emission layer 70, a comparative second electrode 80, a comparative substrate 90, and a polarizing plate 95.

In the fourth comparative example, the comparative second conductive layer 61 includes silver (Ag) and has optical reflectance of 98%, the comparative first conductive layer 62 includes indium tin oxide (ITO) and has optical transmittance of 95%, the comparative organic emission layer 70 includes an organic material and has optical transmittance of 90%, the comparative second electrode 80 includes a magnesium silver alloy (MgAg) and has optical transmittance of 50%, the comparative substrate 90 includes glass and has optical transmittance of 98%, and the polarizing plate 95 has optical transmittance of 45%.

When twelfth light L12, outer light, is irradiated to the organic light emitting diode (OLED) display according to the fourth comparative example from the outside in the direction of the comparative first electrode 60, the twelfth light L12 is passed through the polarizing plate 95 from the outside so as to have a first optical axis of the polarizing plate 95, is transmitted through the comparative substrate 90, the comparative second electrode 80, the comparative organic emission layer 70 and the comparative first conductive layer 62, is reflected by the comparative second conductive layer 61 so as to have a second optical axis in the opposite direction of the first optical axis, is transmitted through the comparative first conductive layer 62, the comparative organic emission layer 70, the comparative second electrode 80 and the comparative substrate 90, and is absorbed by the polarizing plate 95. That is, the twelfth light L12, outer light, is inputted to the organic light emitting diode (OLED) display from the outside and is reflected by the comparative first electrode 60 so that most of the twelfth light L12 is absorbed by the polarizing plate 95. Accordingly, reflection of the outer light of the organic light emitting diode (OLED) display according to the fourth comparative example is prevented by the polarizing plate 95.

Also, when thirteenth light L13, inner light, is emitted by the comparative organic emission layer 70 and is irradiated in the direction of the comparative second conductive layer 61 in the organic light emitting diode (OLED) display according to the fourth comparative example, the thirteenth light L13 is transmitted through the comparative organic emission layer 70 and the comparative first conductive layer 62, is reflected by the comparative second conductive layer 61, is transmitted through the comparative first conductive layer 62, the comparative organic emission layer 70, the comparative second electrode 80, the comparative substrate 90 and the polarizing plate 95, and is irradiated to the outside. When the optical reflectance of the thirteenth light L13, inner light emitted by the comparative organic emission layer 70 through the above-noted path, irradiated in the direction of the comparative second conductive layer 61, reflected by the comparative second conductive layer 61, and seen from the outside, is calculated, 15.8% of optical reflectance is acquired from Equation 10.

$$90*0.95*0.98*0.95*0.90*0.50*0.98*0.45*100=15.8 \quad \text{Equation 10}$$

That is, it is determined that 15.8% of the thirteenth light L13, inner light emitted by the comparative organic emission layer 70 of the organic light emitting diode (OLED) display according to the fourth comparative example, reflected by the comparative second conductive layer 61, and seen from the outside, is irradiated to the outside so that it is found that the form of the comparative first electrode 60 is seen from the outside.

Furthermore, when fourteenth light L14 is emitted by the comparative organic emission layer 70 of the organic light emitting diode (OLED) display according to the fourth comparative example and is irradiated in the direction of the comparative substrate 90, the fourteenth light L14 is passed through the polarizing plate 95 and its luminance is reduced by 55% since the polarizing plate 95 has optical transmittance of 45%. That is, luminance of the image is reduced by the light emitted by the comparative organic emission layer 70.

Regarding the organic light emitting diode (OLED) display according to the fourth comparative example, it is found that the twelfth light L12, outer light inputted to the organic light emitting diode (OLED) display from the outside, is reflected by the comparative second conductive layer 61 and is absorbed by the polarizing plate 95, and 15.8% of the thirteenth light L13, inner light emitted by the comparative organic emission layer 70, is seen from the outside, and the fourteenth light L14, emitted by the comparative organic emission layer 70, is passed through the polarizing plate 95 and its luminance is reduced by 55%. That is, regarding the organic light emitting diode (OLED) display according to the fourth comparative example, reflection of the outer light is prevented since the twelfth light L12, outer light, is not seen from the outside, part of the thirteenth light L13, inner light, is reflected by the comparative second conductive layer 61 and is seen from the outside, and 55% of luminance of the fourteenth light L14 is reduced so that the form of the first electrode 710 is seen from the outside and the whole luminance is reduced, and the display quality of the image displayed by the comparative organic emission layer 70 is deteriorated.

As described above, when the organic light emitting diode (OLED) display according to the second experimental example of the present invention is compared to the organic light emitting diode (OLED) displays according to the third comparative example and the fourth comparative example, the organic light emitting diode (OLED) display according to the second experimental example of the present invention further suppresses the reflection of the inner light and the outer light, and further improves display quality more than the organic light emitting diode (OLED) displays according to the third comparative example and the fourth comparative example.

As determined by the second experimental example of the present invention, the organic light emitting diode (OLED) display 1002 according to the second exemplary embodiment suppresses reflection of the inner light in addition to reflection of the outer light, and thereby improves the display quality of the image displayed by the organic light emitting element 400.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display device, comprising:
    a first electrode including a first electrically conductive layer bearing a black coating of an electrically conductive metal sulfide;
    a second electrode facing the first electrode; and
    an organic emission layer provided between the first electrode and the second electrode.

2. The organic light emitting diode display device of claim 1, wherein the first electrically conductive layer provided between the black coating and the organic emission layer.

3. The organic light emitting diode display device of claim 2, wherein the first electrically conductive layer has a lesser work function than the second electrode.

4. The organic light emitting diode display device of claim 3, wherein the first electrically conductive layer is light reflective.

5. The organic light emitting diode display device of claim 4, wherein the first electrically conductive layer is thinner than the black coating.

6. The organic light emitting diode display device of claim 2, wherein the first electrically conductive layer has a greater work function than the second electrode.

7. The organic light emitting diode display device of claim 6, wherein the first electrically conductive layer is light opaque.

8. The organic light emitting diode display device of claim 2, wherein the first electrode further includes a second electrically conductive layer separated from the organic emission layer with the black coating disposed therebetween.

9. The organic light emitting diode display device of claim 8, wherein the black coating is formed by heat treating the second conductive layer under a sulfur (S) atmosphere.

10. The organic light emitting diode display device of claim 1, wherein the black coating includes silver sulfide ($Ag_2S$).

11. An organic light emitting diode display device, comprising:
    a first substrate;
    a second substrate facing the first substrate; and
    an organic light emitting element provided between the first substrate and the second substrate, and including a first electrode including a first electrically conductive layer bearing a black coating of an electrically conductive metal sulfide, a second electrode facing the first electrode, and an organic emission layer provided between the first electrode and the second electrode.

12. The organic light emitting diode display device of claim 2, wherein a reflectance of the black coating is in a range of 0% to 10%.

13. The organic light emitting diode display device of claim 2, wherein a transmittance of the first electrically conductive layer is in a range of 10% to 99%.

14. The organic light emitting diode display device of claim 2, wherein a reflectance of the black coating is less than a reflectance of the first electrically conductive layer.

15. An electrode of an organic light emitting diode display device having a metal layer bearing a black coating of a metal sulfide.

16. The electrode of claim 15, wherein the metal sulfide is silver sulfide ($Ag_2S$).

17. The electrode of claim 15, wherein the metal sulfide is formed by heat treating a metal under sulfur (S) atmosphere.

* * * * *